US005703504A

United States Patent [19]

Chun et al.

[11] Patent Number: 5,703,504
[45] Date of Patent: Dec. 30, 1997

[54] FEEDFORWARD ADAPTIVE THRESHOLD PROCESSING METHOD

[75] Inventors: Christopher K. Y. Chun; Stephen G. Shook, both of Gilbert, Ariz.; Carl R. Ryan, Cassville, Mo.

[73] Assignee: Motorola, Schaumburg, Ill.

[21] Appl. No.: 578,727

[22] Filed: Dec. 26, 1995

[51] Int. Cl.⁶ ................................................ H03K 5/22
[52] U.S. Cl. ................................................ 327/72; 327/37
[58] Field of Search ........................ 327/23, 26, 27, 327/31, 34, 36, 37, 72, 77, 89, 172, 173, 379, 551, 60, 49

[56] References Cited

U.S. PATENT DOCUMENTS

| | | | |
|---|---|---|---|
| 4,908,875 | 3/1990 | Assael et al. | 327/72 |
| 5,025,456 | 6/1991 | Ota et al. | 327/72 |
| 5,247,211 | 9/1993 | Sakura | 327/72 |
| 5,307,196 | 4/1994 | Kinoshita | 327/72 |
| 5,371,763 | 12/1994 | Ota et al. | 327/72 |
| 5,381,052 | 1/1995 | Kolte | 327/72 |
| 5,392,317 | 2/1995 | Cho et al. | 327/72 |

FOREIGN PATENT DOCUMENTS 404126407  4/1992  Japan ................................. 327/72

OTHER PUBLICATIONS

Robert G. Swartz et al., "Integrated Circuit Packet Receivers for TDM Passive Optical Networks," 1995 Digest of the LEOS Summer Topical Meetings, Aug. 7–11, 1995, pp. 9–10.

Primary Examiner—Timothy P. Callahan
Assistant Examiner—My-Trang Nu Ton
Attorney, Agent, or Firm—Eugene A. Parsons

[57] ABSTRACT

A signal processing circuit (10) generates a bias signal (27) that is used for biasing a comparator (26). An input signal (14) is compared to the bias signal (27) in order to reconstruct the input signal (14) on an output of the comparator. The bias signal (27) is generated by selecting the larger of a percent of the input signal (23) or an offset signal (24) that is larger than a minimum value of the input signal.

12 Claims, 1 Drawing Sheet

FEEDFORWARD ADAPTIVE THRESHOLD PROCESSING METHOD

BACKGROUND OF THE INVENTION

The present invention relates, in general, to communication systems, and more particularly, to signal processing circuits for communication systems.

In the past, a variety of design approaches have been utilized to implement signal processing circuits for communication systems, such as receivers for optical communication systems. Typically, such circuits utilize differential amplifiers and have feedback loops in order to implement automatic gain control and automatic offset control within the receivers.

One problem with the prior receivers is the operation during idle time of the burst-mode communication signal applied to the receiver. During idle time, the feedback loop decreases threshold voltage applied to the differential amplifiers thereby causing the receiver to output noise. Additionally, the peak and minimum input voltage values drift over time causing pulse width distortion or even erroneous signals in the output from the receivers.

Accordingly, it is desirable to have a signal processing circuit that does not oscillate, that does not utilize feedback, and that minimizes pulse width distortion in the output signal.

DETAILED DESCRIPTION OF THE DRAWINGS

Figure 1:
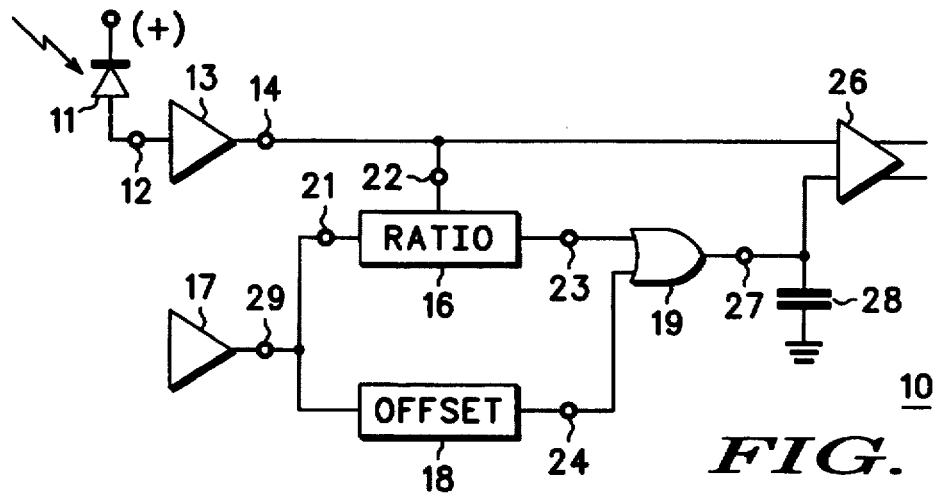
FIG. 1 schematically illustrates a signal processing circuit in accordance with the present invention.

FIG. 1 schematically illustrates a signal processing circuit 10 suitable for receiving signals from communication systems and other types of systems including burst-mode signals. Circuit 10 includes a received signal input 12 suitable for accepting a received signal. For example, the received signal on input 12 can be the signal from a photo-detector 11 that detects light received by a fiber optic communication system. The received signal on input 12 is applied to an input of a preamplifier 13 which amplifies the received signal to form an input signal on an output of preamplifier 13. The input signal is applied to a signal input 14 of circuit 10.

A reference amplifier 17 generates a reference signal, on a reference output 29, that is substantially equal to the minimum value of the input signal that is applied to input 14. The reference signal and the input signal are applied to inputs 21 and 22, respectively, of a ratio circuit 16. The ratio circuit generates a ratio signal, on an output 23, that is proportional to a difference between the input signal and the reference signal. That is, the reference signal is a percent of the value of the input signal. Because the reference signal is substantially equal to the minimum value presented by the input signal, the ratio signal is proportional to the difference between the current value of the input signal and the minimum value of the input signal. The ratio value utilized to develop the proportional difference is selected to provide a detection point for determining the state of the input signal on input 14 and to compensate for distortions that may occur on the received signal applied to input 12. In the preferred embodiment, the ratio is selected to be approximately one-to-one so that the ratio signal is approximately one-half the difference between the input signal and the reference signal (minimum value of the input signal). This facilitates accurate reproduction of the input signal.

An offset circuit 18 has an input connected to output 29 in order to receive the reference signal. Circuit 18 generates an offset signal, on an output 24, that is larger than the reference signal. As will be seen hereinafter, the value of the offset signal assists in ensuring that circuit 10 does not respond to noise when the input signal is at a minimum value for long periods of time. In the preferred embodiment, the offset signal is approximately greater than the reference signal by the amount of noise expected in the received signal on input 12.

An amplitude circuit 19 has a first input connected to output 23 of ratio circuit 16, and a second input connected to output 24 of offset circuit 18. Circuit 19 receives the ratio signal and the offset signal, and generates a bias signal, on an output 27, that has a value substantially equal to the larger of either the ratio signal or the offset signal. That is, circuit 19 passes the larger of the ratio signal or the offset signal to output 27 in order to generate the bias signal. Thus, circuit 19 ensures that the bias signal on output 27 is always larger than the minimum value of the input signal, by at least the value of the offset signal. Using the larger of the reference or offset signals assist in minimizing the response of circuit 10 to noise on input 14. A storage element 28, for example a capacitor, is connected to output 27 used for holding the value of the bias signal in order to minimize rapid changes due to changes on the input signal.

A comparator 26 receives the input signal on a first input while the bias signal is received on a second input of comparator 26. Comparator 26 generates an output that represents the input signal having a midpoint that is substantially equal to the value of the bias signal. As shown in FIG. 1, comparator 26 has a differential output, however, the output of comparator 26 can also be a single ended output.

In operation, ratio circuit 16 ensures that the ratio signal is greater than the minimum value of the input signal, as provided by the reference signal, and less than the maximum value of the input signal. During burst-mode when the input signal is minimum for long periods of time, circuit 19 utilizes the offset signal for the bias signal in order to ensure that the bias signal is larger than the minimum value of the input signal. Because, the value of the bias signal provided to comparator 26 is always larger than the minimum value of the input signal, the response comparator 26 to noise is substantially eliminated during these burst-mode intervals.

Figure 2:
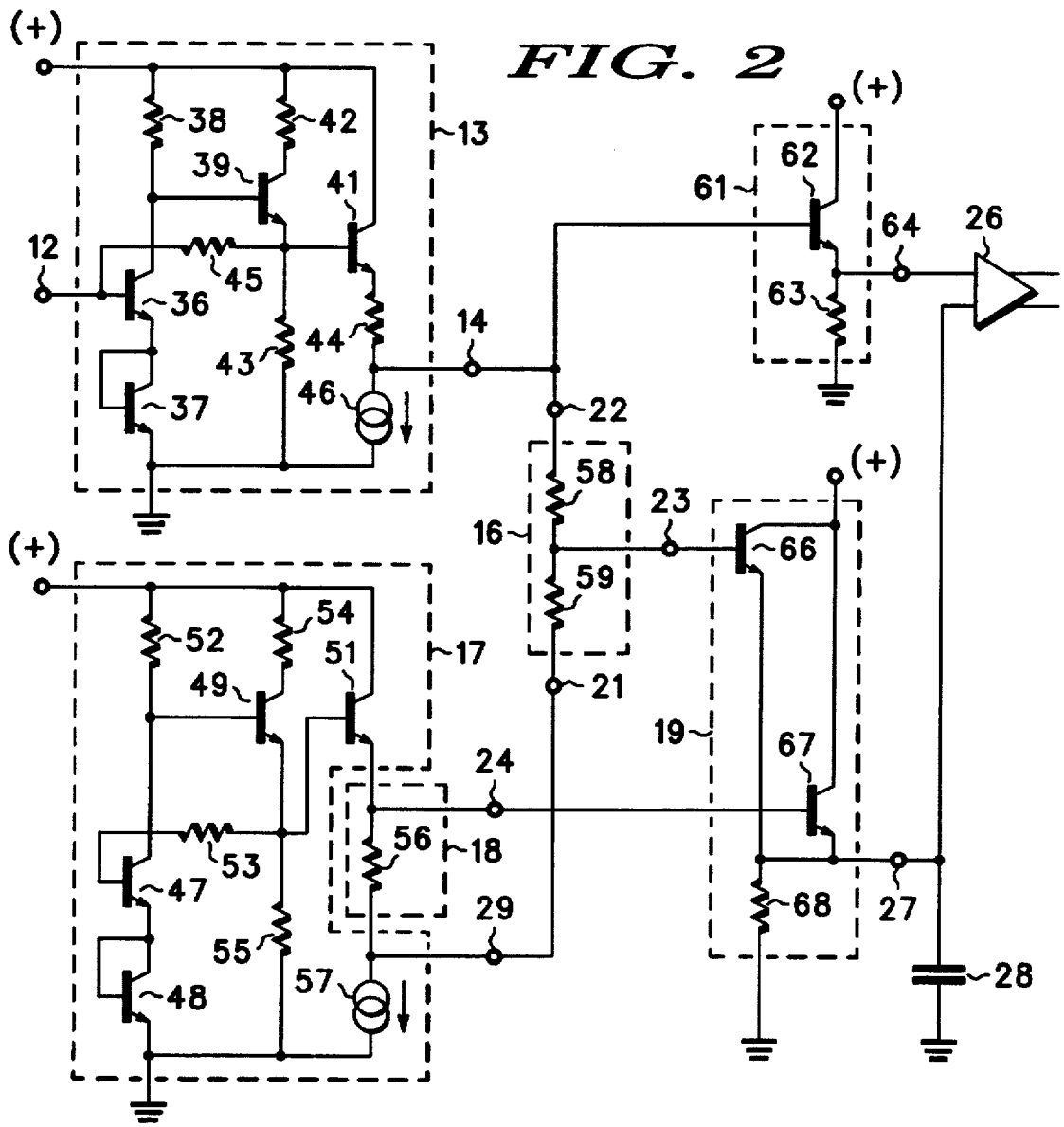
FIG. 2 schematically illustrates a circuit embodiment of a portion of the signal processing circuit shown in FIG. 1 in accordance with the present invention.

FIG. 2 schematically illustrates a circuit embodiment for portions of circuit 10 shown in FIG. 1. Elements of FIG. 2 that have the same reference numbers as FIG. 1 are the same as the corresponding FIG. 1 elements. Although described hereinafter in terms of voltage, it should be noted that the received signal, input signal, reference signal, ratio signal, offset signal, and bias signal could all be either voltage or current. Thus, preamplifier 13, and reference amplifier 17 could both be either a voltage, current, transimpedance, or transconductance amplifier.

As illustrated in the embodiment shown in FIG. 2, preamplifier 13 includes a first transistor 37 that is connected as a diode and is in series with an emitter of a second transistor 36. Transistor 36 has a base connected to input 12 and a collector connected in series with a resistor 38 to a positive supply terminal. A base of a third transistor 39 is also connected to the collector of transistor 36. Transistor 39 also has a collector connected in series with a resistor 42 to the positive supply terminal, and an emitter connected in series with a resistor 43 to a negative supply terminal. A fourth transistor 41 has a base connected to the emitter of transistor 39, and a collector connected to the positive supply terminal. An emitter of transistor 41 is connected to a resistor 44 which in turn is connected in series with a current source 46 to the negative supply terminal. The output of preamplifier 13 is taken between the series connection of resistor 44 and current source 46.

Reference amplifier 17 is constructed similarly to preamplifier 13. A transistor 47 functions similarly to transistor 36 of preamplifier 13. However, since amplifier 17 does not have an input the base of transistor 47 is not driven by an input signal. Transistors 48, 49, and 51 along with resistors 52, 53, 54, 55 and 56, and source 57 function similarly to transistors 37, 39, 41, resistors 38, 45, 42, 43, 44, and source 46, respectively. In the preferred embodiment, preamplifier 13 and amplifier 17 are formed on the same substrate and with substantially identical transistor sizes and resistor values so that the reference signal on output 29 substantially tracks the minimum value of the input signal on the output of preamplifier 13.

Offset circuit 18 is formed by utilizing the signal on the collector of transistor 51 as offset output 24. This ensures the value of the signal on output 24 is always greater than the value of the signal on output 29. Ratio circuit 16 is formed as a voltage divider utilizing a first resistor 58 and a second resistor 59 connected in series between input 14 and output 29. Output 23 of circuit 16 is connected to the node between resistor 58 and 59 so that the value on output 23 is proportional to the difference between the value of the input signal on input 14 and the reference signal on output 29. The proportional value is the ratio of the value of resistor 59 to the total value of resistors 58 and 59.

Amplitude circuit 19 is formed as a multiple emitter follower circuit that has a first transistor 66 parallel connected to a second transistor 67. Transistors 66 and 67 both have a collector connected to the positive supply terminal and an emitter connected to an emitter follower resistor 68. The base of transistor 66 receives the ratio signal on output 23 while the base of transistor 67 receives the offset signal on output 24. When the value of the ratio signal drops below the value of the offset signal, transistor 67 clamps the value applied to output 27 to the value of the offset signal minus the $V_{BE}$ drop of transistor 67. When the value of the ratio signal is larger than the offset signal, transistor 66 pulls the value of the bias signal on output 27 to the larger value of the ratio signal minus the $V_{BE}$ drop of transistor 66. Consequently, the bias signal is always the larger of the ratio signal or the offset signal, minus a $V_{BE}$ drop.

A level shifter 61 is an emitter follower that shifts the voltage level of the input signal on input 14 by a $V_{BE}$ drop to compensate for the voltage shift applied by circuit 19. In the preferred embodiment, shifter 61 is formed on a substrate with circuit 19 and has identical transistor sizes and resistor values to ensure that the voltage shift applied by shifter 61 tracks the voltage shift applied by circuit 19.

By now it should be appreciated that there has been provided a novel signal processing circuit and method. Using a reference amplifier to determine the minimum value of the input signal eliminates the need to analyze the input signal to determine its minimum value, thus, improving the accuracy of the signal processing circuit. Generating a bias signal by using a ratio signal that is the difference between the reference signal and the input signal allows the bias signal to track variations in the input signal over time yet ensures that the bias signal is never less than the input signal.

Ensuring the reference signal is substantially equal to a minimum value of the input signal facilitates reducing the response to input noise. Utilizing an offset signal that is larger than the reference signal ensures that the bias signal is always larger than the minimum value of noise on the input signal reduces the response to noise during burst-mode intervals of the input signal.

We claim:

1. A signal processing method comprising:
   applying an input signal to a ratio circuit;
   generating a reference signal having a value substantially equal to a minimum value of the input signal;
   generating a ratio signal that is proportional to a difference between the input signal and the reference signal;
   generating an offset signal that has a larger amplitude than the reference signal; and
   biasing a comparator with a one of the offset signal and the ratio signal which has a larger amplitude while using the comparator for receiving the input signal.

2. The method of claim 1 wherein biasing the comparator includes applying the one of the offset signal and the ratio signal with the larger amplitude to a storage element for biasing the comparator.

3. The method of claim 1 wherein applying the input signal to the ratio circuit includes amplifying a received signal to form the input signal.

4. The method of claim 3 wherein biasing the comparator includes shifting a voltage level of the input signal prior to using the comparator for receiving the input signal.

5. The method of claim 1 wherein generating the ratio signal includes coupling the input signal and the reference signal to inputs of the ratio circuit.

6. The method of claim 1 wherein generating the ratio signal includes applying the input signal and the reference signal to a voltage divider.

7. A signal processing method comprising:
   providing an input signal and a reference signal;
   generating a first signal from the reference signal, which first signal is a percent of the input signal;
   generating offset signal from the reference signal wherein the offset signal has a larger amplitude than the reference signal;
   generating a bias signal by selecting a one of the first signal and the offset signal with a larger amplitude; and
   comparing the input signal to the bias signal.

8. The method of claim 7 wherein generating the first signal includes forming the percent of the input signal by using a percent of a difference between the input signal and the reference signal.

9. The method of claim 8 wherein using the percent of the difference between the input signal and the reference signal includes applying the input signal and the reference signal to a voltage divider.

10. The method of claim 7 wherein comparing the input signal to the bias signal includes storing a value of the bias signal on a storage element for holding the value of the bias signal while comparing the input signal to the bias signal.

11. The method of claim 10 wherein storing the value of the bias signal on the storage element includes applying the bias signal to a capacitor.

12. The method of claim 7 wherein comparing the input signal to the bias signal includes applying the input signal and the bias signal to a comparator wherein the input signal is compared to the bias signal.

* * * * *